(12) United States Patent
Usenko et al.

(10) Patent No.: US 6,387,829 B1
(45) Date of Patent: May 14, 2002

(54) SEPARATION PROCESS FOR SILICON-ON-INSULATOR WAFER FABRICATION

(75) Inventors: Alexander Yuri Usenko, Murray Hill; William Ned Carr, Montclair, both of NJ (US)

(73) Assignee: Silicon Wafer Technologies, Inc., Newark, NJ (US)

( * ) Notice: Subject to any disclaimer, the term of this patent is extended or adjusted under 35 U.S.C. 154(b) by 0 days.

(21) Appl. No.: 09/543,998

(22) Filed: Apr. 6, 2000

Related U.S. Application Data (60) Provisional application No. 60/139,851, filed on Jun. 18, 1999.

(51) Int. Cl.$^7$ ...................... H01L 21/425; H01L 21/265
(52) U.S. Cl. ........................................ 438/977; 438/120
(58) Field of Search ........................... 438/15, 977, 120

(56) References Cited

U.S. PATENT DOCUMENTS

| | | | |
|---|---|---|---|
| 4,846,931 A | 7/1989 | Gmitter | |
| 5,250,460 A | 10/1993 | Yamagata | |
| 5,374,564 A | 12/1994 | Bruel | |
| 5,710,057 A | 1/1998 | Kenney | |
| 5,994,207 A | * 11/1999 | Henley et al. | 438/515 |
| 6,013,567 A | 1/2000 | Henley | |
| 6,221,774 B1 | * 4/2001 | Malik | 438/690 |

* cited by examiner

*Primary Examiner*—Amir Zarabian
*Assistant Examiner*—Beth E. Owens
(74) *Attorney, Agent, or Firm*—DeMont & Breyer, LLC (57) ABSTRACT

A process for manufacturing a silicon-on-insulator wafer from a silicon wafer assembly. The assembly is made of two wafers. One of the wafers contains a fragile layer. The fragile layer is a layer containing a high amount of hydrogen. An amount of energy from an energy source is applied to the assembly to separate the assembly along the fragile layer thus forming a silicon-on-insulator wafer and a leftover wafer. The energy source is selected from the group consisting of: ultrasound, infrared, hydrostatic pressure, hydrodynamic pressure, or mechanical energy. The amount of energy is chosen to be sufficient to transform the fragile layer into a quasi-continuous gaseous layer. Under separation the hydrogen-enriched layer transforms into layer consisting of hydrogen platelets and hydrogen microbubbles.

13 Claims, 9 Drawing Sheets

SEPARATION PROCESS FOR SILICON-ON-INSULATOR WAFER FABRICATION

This application claims priority from the provisional patent application entitled "Separation Process For Silicon-On-Insulator Wafer" and, filed Jun. 18, 1999 and assigned application No. 60/139,851, the disclosure of which is hereby incorporated incus entirety for all purposes.

BACKGROUND OF THE INVENTION

The present invention relates to the manufacture of silicon-on-insulator substrates. More particularly, the invention provides a technique for separating (cleaving) a substrate as part of the fabrication process of silicon-on-insulator wafers for semiconductor integrated circuits and microelectromechanical systems.

Delamination of thin films (micron range thickness) from solids such as a single crystal is a processing step that is useful for variety of technologies, including semiconductor processing technology. Prior art includes separation methods as (1) ion cut with thermal initiation (Bruel), (2) ion cut with jet initiation (Henley), and (3) variations of sacrificial layer etching (Gmitter, Yonehara, Kenney).

The separation technique through a hydrogen-rich layer was described by Bruel, U.S. Pat. No. 5,374,564 [1]. This technique is a part of Bruel's process [1] used to fabricate silicon-on-insulator wafers. The technique uses thermal treating of a wafer assembly that includes a hydrogen-implanted wafer. The annealing temperature used is above that at which ion implantation takes place. Typical annealing temperatures are in range from 400 to 500° C. Under annealing the implanted hydrogen begins to diffuse inside of the wafer. Hydrogen coagulates into precipitates that serve as nuclei for subsequent structure transformations. Then flat platelets consisting of hydrogen are formed from the nuclei. The platelets are arranged along <100> silicon crystallographic planes. The platelets have top and bottom silicon <100> surfaces with dangling bonds terminated by hydrogen. Next, bigger platelets continue to grow in expense of smaller platelets according to the Ostvald ripening mechanism. Finally, the continuous hydrogen layer is formed along the plane of the maximum implanted hydrogen. Following annealing, the former single wafer is separated into two thinner wafers.

Another technique to delaminate a top layer from a silicon wafer using the buried hydrogen-rich layer is described by Henley in U.S. Pat. No. 6,013,567 [2]. The wafer is cleaved along the hydrogen-rich plane using a pressurized fluid jet applied initially to the edge of the wafer. The cleavage initiates at the edge due to the jet action and the cleavage wave then propagates through the substrate to release a thin film of material from the substrate.

Still another technique to selectively peel a film from a single crystal is described by Gmitter in U.S. Pat. No. 4,846,931 [3]. The technique is usually referred as epitaxial lift-off. In this technique an epitaxial film is released from a single crystal substrate upon which it is grown. The technique comprises (a) providing a thin release layer (1000 Å) between the film to be grown and the substrate; (b) growing the epitaxial film(s); (c) applying a polymeric support layer which is under tension over the film; and (d) selectively etching the release layer, the tension in the support layer causing the edges of the film to curve upward as the release layer is etched away.

A variation of the epitaxial lift-of process is described by Yamagata in U.S. Pat. No. 5,250,460 [4] and subsequent patents on the ELTRAN process of fabrication of silicon-on-insulator wafers. In this technique the film separation is obtained by etching off a sacrificial layer comprised of porous silicon.

Still another variation of the epitaxial lift-off process for film separation is described by Kenney in U.S. Pat. No. 5,710,057 [5]. In this technique an etchant distribution is facilitated by capillary action in trenches preformed in the seed substrate.

A disadvantage of the Bruel [1] technique is that the roughness of the as-cut surface requires polishing (e.g., CMP) to smooth the surface. This polishing affects the thickness uniformity of the device layer across the wafer. Thus, the polishing process, while improving local roughness, simultaneously increases thickness variations. Another disadvantage of the Bruel process [1] is that the assembly sometimes cleaves along an undesired plane. The desired plane is along the peak density of the implanted hydrogen. The undesirable plane is at a prebonded interface between wafers of the assembly. Defective silicon-on-insulator wafers are the result.

A disadvantage of the epitaxial lift-off technique [3] is that the area of delaminated film is limited to about 1 square inch, that is much less that typical silicon wafer size (4–12 inches in diameter). So the process is not applicable to mainstream semiconductor processing.

A disadvantage of etch-stop based separation techniques [3,4,5] is the difficulty in obtaining a uniform layer thickness for large areas. Since the etchant etches silicon in addition to the sacrificial layer, there is a tendency to reduce the thickness at the thin film silicon near the outer perimeter of the wafer. The result is a separated thin film of decreasing thickness along radii toward the wafer perimeter.

A disadvantage of the side jet technique [2] is that plasma immersion ion implantation dose needed in the process is $10^{18}$ cm$^{-2}$. Such a high dose severely deteriorates the quality of the delaminated layer.

SUMMARY OF THE INVENTION

A technique is detailed for forming a silicon film from a donor silicon substrate with <100> or <111> surface orientations.

A The technique utilizes a step of forming a hydrogen-rich layer in a donor substrate at a selected depth underneath the surface where the hydrogen atoms have a relatively high concentration to define a donor substrate material above the selected depth. The hydrogen-rich layer may be obtained by implanting hydrogen ions through a surface into the donor wafer.

To initiate separation of thus prepared wafer, an energy source is applied to the substrate. The source is selected from the group consisting of ultrasound, hydrostatic pressure, hydrodynamic pressure, infrared light, mechanical, or combination thereof. Said energy source is applied in such a way that energy is deposited preferentially in the hydrogen-rich layer.

The application of said energy source coagulates hydrogen into nuclei having platelet shapes oriented along crystallographic cleavage planes, that is usually the <100> plane. The platelets then form a continuous layer thus releasing the adjacent silicon film.

For said ultrasound and infrared energy cases, choosing preferable parameters means the wavelength is chosen smaller than said donor substrate material thickness (typically less than 10 micrometers).

Advantage of the present invention is the technique adds flexibility for creating customized silicon-on-insulator based microstructures and integrated circuits. Also the technique rises the yield of silicon layer transfer as the hydrogen platelet coagulation along the interface of prebonded silicon wafers is suppressed. Also the technique improves a surface roughness of the silicon-on-insulator wafers obtained.

BRIEF DESCRIPTION OF THE DRAWINGS

FIGS. 1 through 4 show prior art that is related to heat-caused separation [1].

FIGS. 5 through 8 shows previous art that is related to jet-caused separation [2].

DETAILED DESCRIPTION OF THE PREFERRED EMBODIMENTS

The present invention provides a technique for removing a thin film of material from a substrate while maintaining the structural integrity of both separated parts. Said thin film of material is prebonded to a stiffener, for example, an oxidized silicon wafer thus forming silicon-on-insulator wafer.

Figure 1:
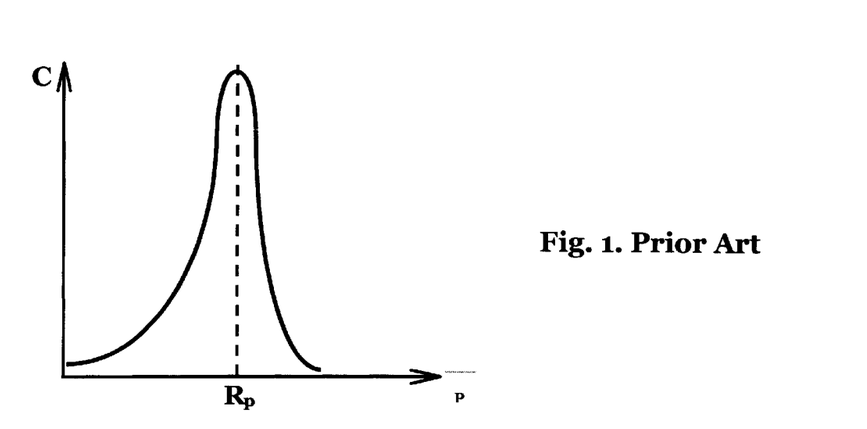
FIG. 1 shows the concentration profile of the hydrogen ions as a function of the penetration depth.
Figure 2:
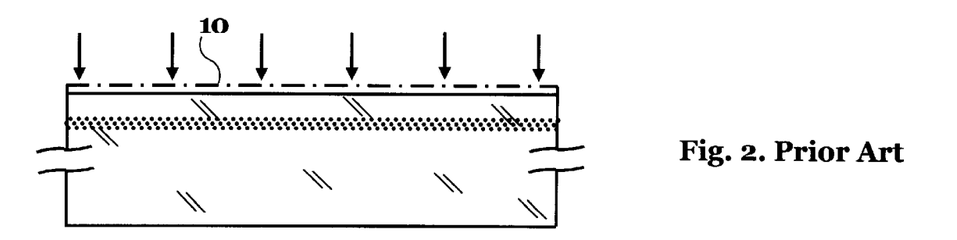
FIG. 2 shows the monocrystalline semiconductor wafer exposed to a bombardment of H$^+$ ions and within which has appeared a gas microbubble layer produced by the implanted particles.
Figure 3:
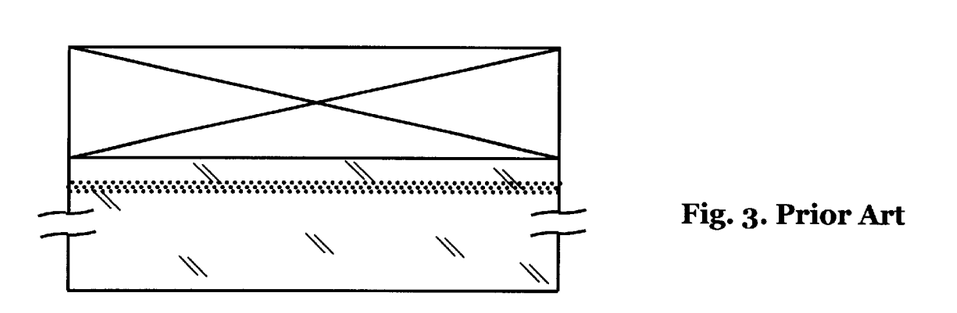
FIG. 3 shows the semiconductor wafer of FIG. 2 and covered with a stiffener.
Figure 4:
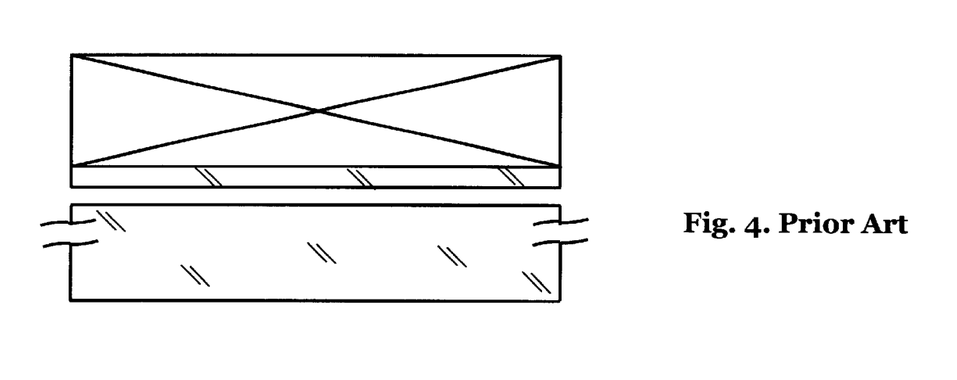
FIG. 4 shows the cross-section view of assembly of the semiconductor wafer and the stiffener wafer shown in FIG. 3 at the end of the separation phase, when cleaving has taken place between the film and the substrate mass.
Figure 5:
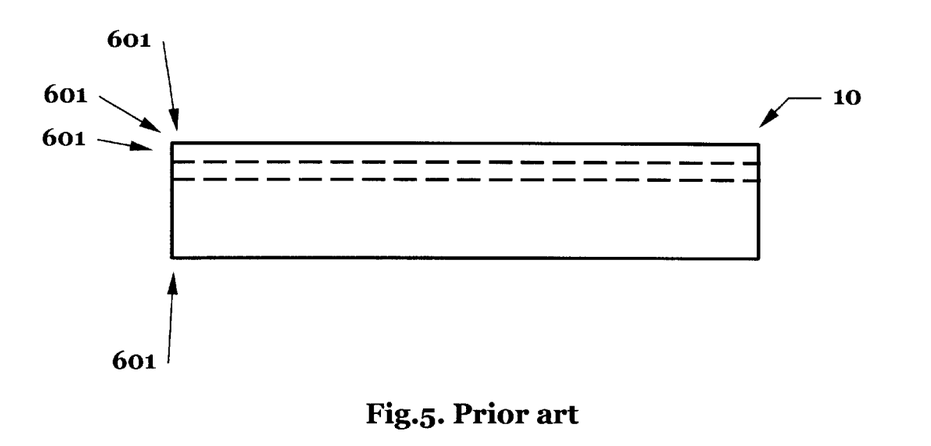
FIG. 5 is a simplified cross-sectional view of an implanted substrate 10 using selective positioning of cleave energy 601.
Figure 6:
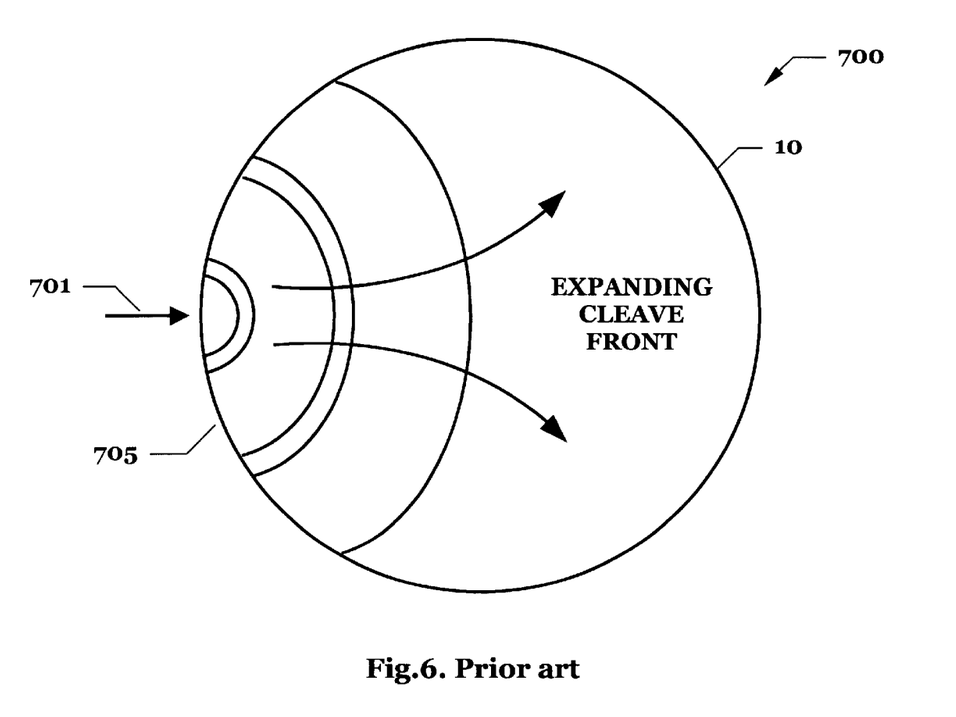
FIG. 6 illustrates the controlled-propagating cleave with successive impulses 701, 705, 709 to initiate and then propagate a clearing process 700.
Figure 7:
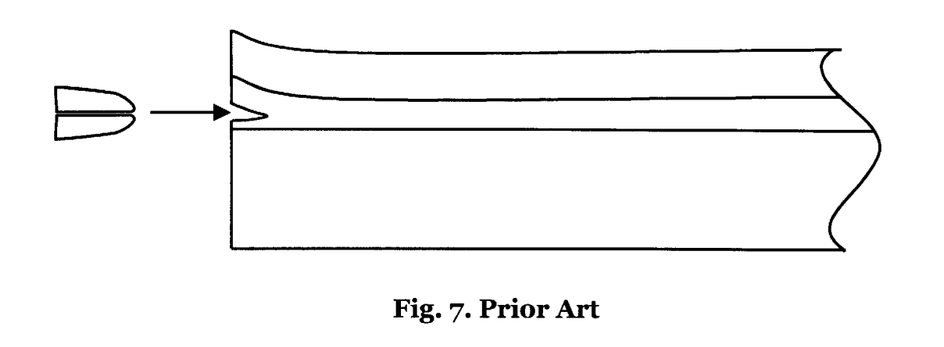
FIG. 7 shows a cross-sectional view of a pressurized fluid jet from a fluid nozzle to perform a controlled cleaving process.
Figure 8:
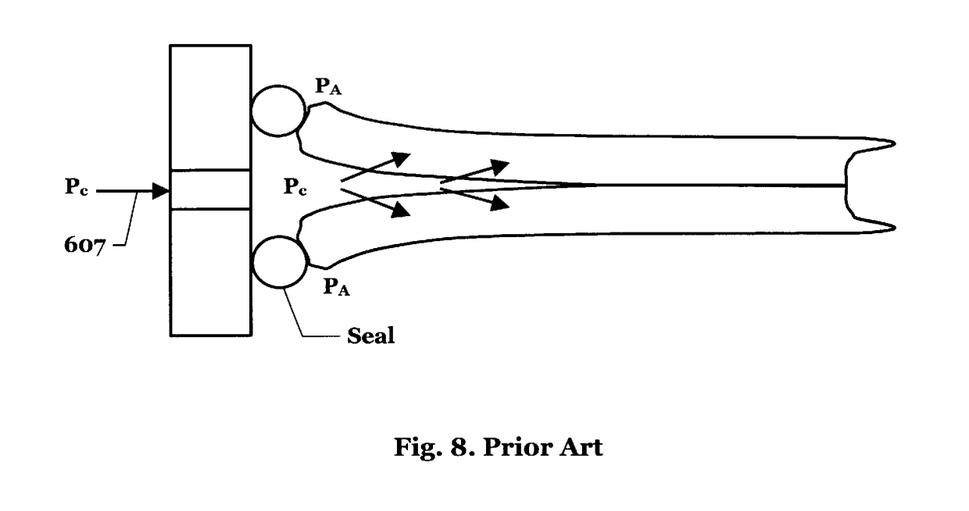
FIG. 8 shows a cross-sectional view of a pressurized fluid source 607.
Figure 9A:
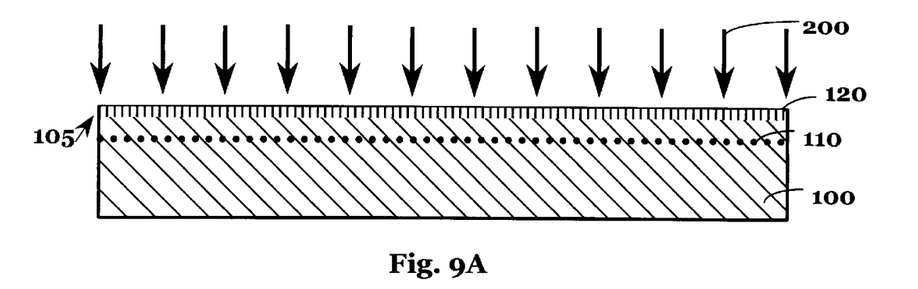
FIG. 9 shows a cross-sectional view that illustrates the separation process due to present invention.
Figure 9B:
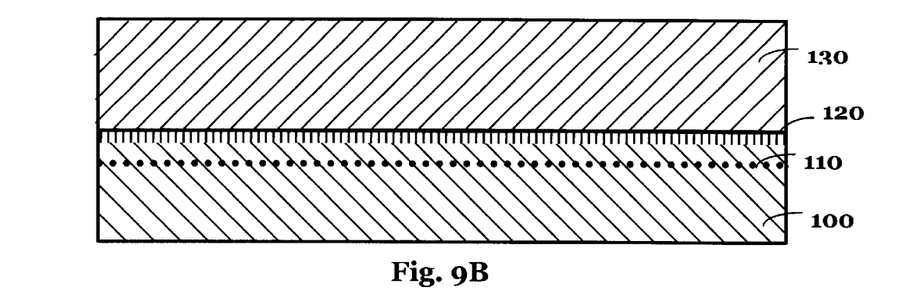
Figure 9C:
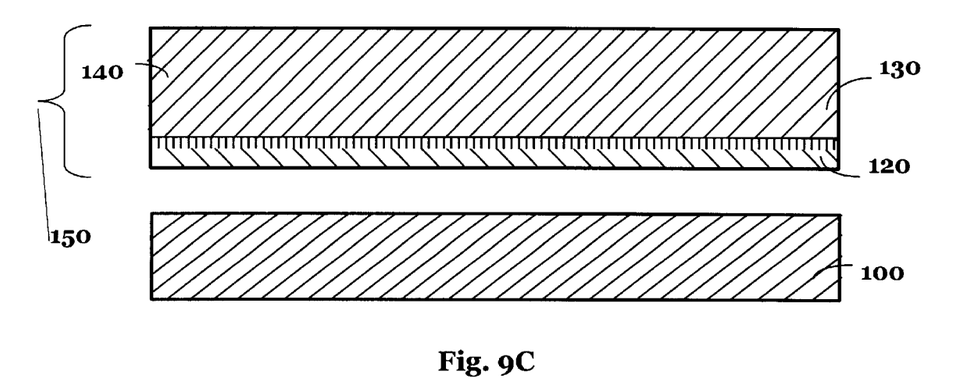

The embodiments which will now be described in conjunction with the above drawings FIGS. 9 to 14, relate to the separation of a thin film from a single crystal silicon wafer previously implanted with proton particles or with hydrogen ions. The implanted wafer can be covered with thermally grown silicon dioxide layer 105 (FIG. 9) before the implantation stage. FIG. 9A is a simplified cross-sectional view of the initial oxidized and wafer 100 implanted with protons 200 that form a hydrogen-rich layer 110 and a thin film to be separated 120. FIG. 9B is a simplified cross-sectional view diagram of the wafer 100 with a stiffener wafer 130 attached. This is an initial structure to be separated. FIG. 9C shows the final step of the separation process when the top assembly consisting of stiffener wafer 130 and separated thin film 120 is completely detached from initial implanted substrate 100.

The process is used for the manufacture of silicon-on-insulator wafers from regular silicon wafers that are pre-implanted with ions. The wafer undergoes an energy load that transforms the pre-implanted layer into of a layer 110 of gaseous microbubbles in the wafer. The wafer can be than easy separated into two wafers along the layer of microbubbles. In the FIG. 9A the implantation 200 occurs through an upper surface of the wafer 100 that is substantially parallel to a main crystallographic plane of the substrate, for example the <100> plane. The implanted specie is preferably protons.

The implantation allows for the formation of a layer of gaseous microblisters 110 within the volume of the wafer at a depth approximately equal to the average ion penetration depth. This layer of microblisters delimits a surface layer 120 within wafer 100, which will form the top part 120 of silicon-on-insulator wafer 140 in FIG. 9C. In particular, it should be noted that during ion implantation the wafer is preferably kept at a temperature below the temperature at which the atoms of the implanted gas can move away by thermal diffusion from the crystal.

For all preferred embodiments described below, an amount of energy from an energy source is applied to the wafer assembly FIG. 9B. After applying the amount of energy a continuous hydrogen layer is formed at the place of the hydrogen-rich layer 110 thereby releasing silicon-on-insulator wafer 150 (FIG. 9C) from byproduct wafer 100 (FIG. 9C.)

Preferred Embodiment 1: Separating with Ultrasound Energy Load

Figure 10:
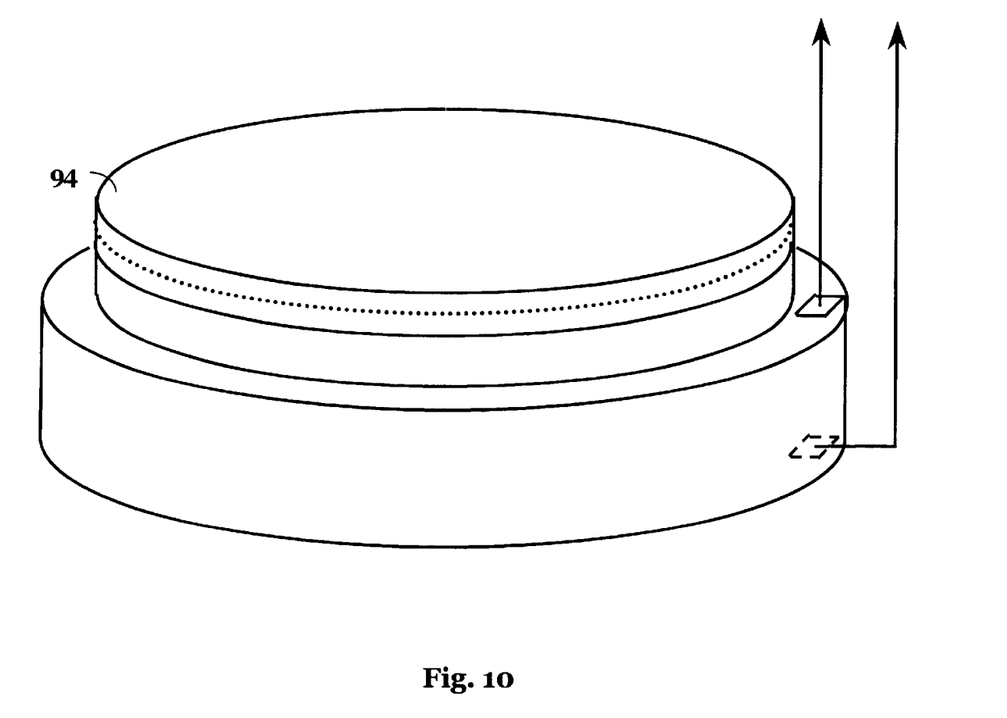
FIG. 10 illustrates the first preferred embodiment of the separation process due to the present invention where an ultrasound load is used.

FIG. 10 shows the preferred embodiment utilizing ultrasound as the activation energy for separation. The ultrasound energy load is applied to the wafer assembly FIG. 9C through either the top or bottom surface.

For the separation, the implanted wafer is subjected to a sensitizing load for a given time, chosen such that the hydrogen in the substrate which was introduced by the hydrogen implantation is partly released from its attachments to the defects (which were generated by the hydrogen trap-inducing implantation) and as well by the hydrogen implaimplantation itself. This treatment causes the formation and growth of hydrogen filled microcracks at a depth close to the maximum in the concentration depth profile of implanted hydrogen. This step must not cause hydrogen induced surface blisters, which would prevent subsequent bonding of the first substrate to a second substrate.

At the end of energy activation the implanted hydrogen in the substrate is fully released from chemical bonding to the defects. These defects were generated by the hydrogen trap-inducing implantation as well as by the hydrogen implantation itself, to cause growth, overlapping and coalescence of hydrogen-filled microcracks, which split the monocrystalline thin layer from the rest of the first substrate thereby allowing the transferrance of the thin monocrystalline layer to the second substrate.

Ultrasound waves propagated through the bulk of a solid 94 (FIG. 10) affect the properties of point and extended defects. This processing is referred to as the process of ultrasound treatment. Ultrasound vibrations applied to a semiconductor with a power density W, exceeding some threshold value, $W_{th}$ are able either to generate Frenkel pairs or to force the dissociation of complex centers composed of two or more point defects. The value of $W_{th}$ was found to be of the order of 10 W/cm³. In the opposite case, i.e. when $W<W_{th}$, a different effect related to the interaction of point defects and extended lattice defects has been found in single crystals. This effect of ultrasound is an enhancement of gettering by sinks (dislocations, grain boundaries, precipitates) of both intrinsic and extrinsic point defects. The ultrasound vibrations can reduce the energy barrier for the diffusion of defects as well as the barrier for their capture by sinks. The present invention uses the effect of the enhancement of gettering by sinks, i.e. when $W<W_{th}$.

In the preferred embodiment, ultrasound vibrations were generated in the wafer using a circular 100 mm diameter and 3 millimeter thickness piezoelectric transducer PZT-5A. Transducers were driven by a function generator and power amplifier adjusted to the resonance frequency of the transducer radial or thickness vibrations. For good acoustic contact, the wafer was pressed against a transducer front surface with a spring. The ultrasound transducer was operated at resonance of its radial vibrations of 25 kHz. The wafer assembly can be placed with either the stiffener or the cleavable surface to the transducer. The ultrasound load time was 5 minutes or more (up to 120 minutes). The amplitude of sample vibrations in acoustic contact with the transducer was monitored by a calibrated contact acoustic probe. The maximum acoustic strain amplitude on the film surface was of the order of $10^{-5}$. The temperature of the sample under ultrasound load was stabilized at 50° C., and monitored by a thermocouple attached to the wafer surface.

Preferred Embodiment 2: Separating with Hydrostatic Pressure Energy Load

Figure 11:
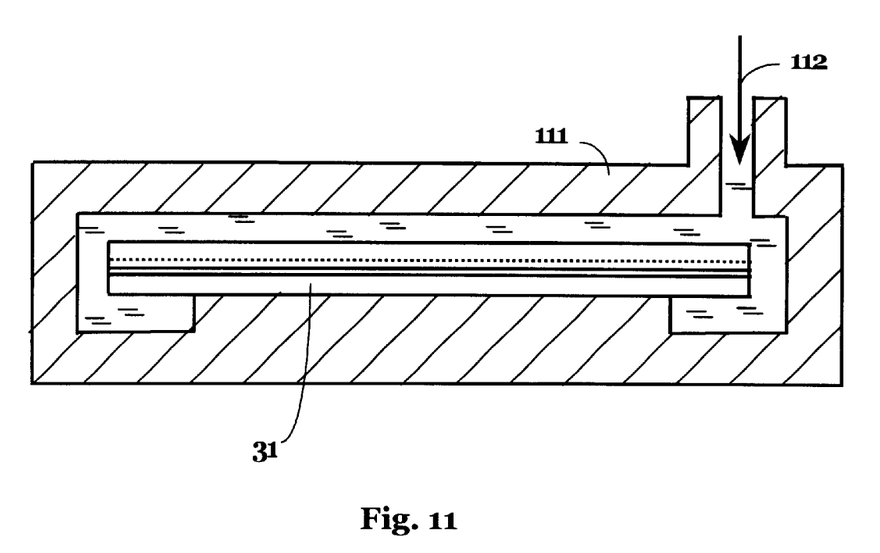
FIG. 11 illustrates the second preferred embodiment of the separation process due to the present invention where a hydrostatic pressure load is used.

FIG. 11 shows the preferred embodiment using a hydrostatic pressure load to cause separation. The wafer assembly 31 is placed into hydrostatic pressure cell 111 and loaded with a pressure higher than 0.2 GPa. In silicon (and other diamond or zinc-blend structured materials), the diffusion constant increases with pressure. This is in contrast with the situation in close-packed materials in which diffusion diminishes with compression. Pressure cells, which use compressed gas, can accommodate wafer size samples. The compressed gas cells create a pressure up to 1.5 Gpa. This pressure is enough to cause separation of the silicon wafers. Argon 112 is introduced into the cell 111 to approach hydrostatic conditions.

Preferred Embodiment 3: Separating with Infrared Energy Load

Figure 12A:
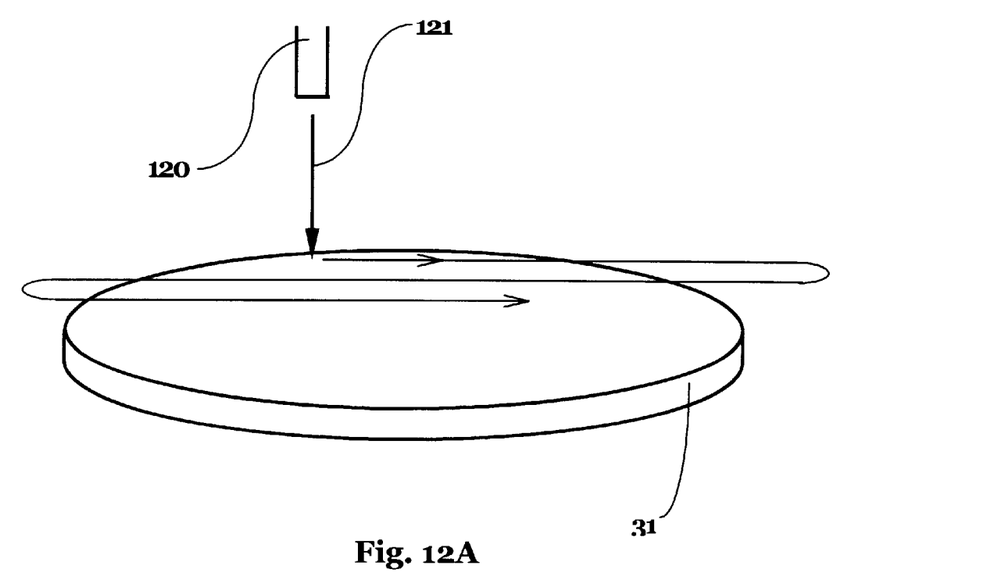
FIG. 12 illustrates the third preferred embodiment of the separation process due to the present invention where infrared laser scanning is used.
Figure 12B:
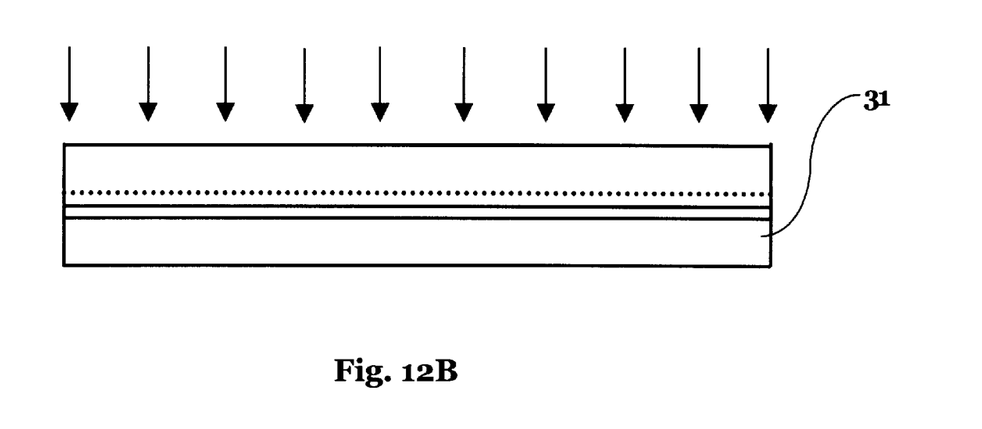

FIG. 12 shows the preferred embodiment using an infrared energy source to cause separation. FIG. 12A illustrates using of neodymium glass laser 120 in scanning mode. Said laser produces a light beam 121 that is directed normally to the surface of the wafer assembly 31 to be separated. Scanning begins from the edge of said assembly 31 thus creating a separation front. The separation front propagates following the scanning laser beam. To complete separation, an entire area of the wafer assembly 31 shoud be scanned. Said light wavelength should be chosen outside of the silicon band edge absorption. If the energy of the photons is lower than the forbidden gap, the photons are absorbed mostly by defects. The hydrogen-rich layer is the defect-rich and the light energy is absorbed mostly in this layer thus promoting hydrogen movement with formation of platelets the similar way as it happens under heat treatment. The difference with the thermal treatment caused separation described by Bruel is that the separation front is single and it propagates through the entire wafer. Finally it leaves smoother surfaces after the separation as compared to a multiple separation front case. Steps on the surface after separation appear mostly at places where the two separation fronts meet. Typical laser processing characteristics are: beam cross-section diameter 1 millimeter, laser pulse repetitive rate 100 Hz, pulse duration 70 nanoseconds, horizontal scanning speed 50 mm/sec, energy per pulse 0.01 Joule, vertical scanning step 0.5 millimeters. In the case of using the neodymium laser (wavelength 1.06 micrometer), the silicon absorption coefficient is 50 cm$^{-1}$ for single crystal silicon, and more than 10$^3$ cm$^{-1}$ for amorphous silicon. The hydrogen-rich region has about the same absorption coefficient as the amorphous silicon, so silicon bulk remains almost unheated, while the hydrogen-rich region melts at laser pulse energies higher than about 1 Joule/cm². Pulsed character of the laser processing is also important in this case. For the nanosecond-range pulse duration the heat produced by the pulse dissipates during the pulse on distances less than 1 micrometer, thus providing an adiabatic mode of the processing. The pulsed laser treatment heats predominantly the hydrogen-rich layer. In the heated layer the implanted interstitial hydrogen forms hydrogen clusters. The clusters are nuclei of hydrogen platelets. Further heating causes the nuclei of platelets to grow into bigger platelets. Further, the growing platelets begin to overlap. The part of the wafer assembly with the dense layer of platelets is a separated part. A border between separated and non-separated parts is a separating front. The front moves following the scanning laser beam. FIG. 12B shows the different geometry of separation with pulsed infrared processing where the entire wafer is processed in a single pulse. This preferred embodiment is requires the high power laser of a flash lamp source. The threshold energy for the separation is about 0.2 Joule/cm², which translates into a 15 Joule/pulse light source requirement for 100 mm diameter wafers.

Preferred Embodiment 4: Separating with Hydrodynamic Energy Source

Figure 13A:
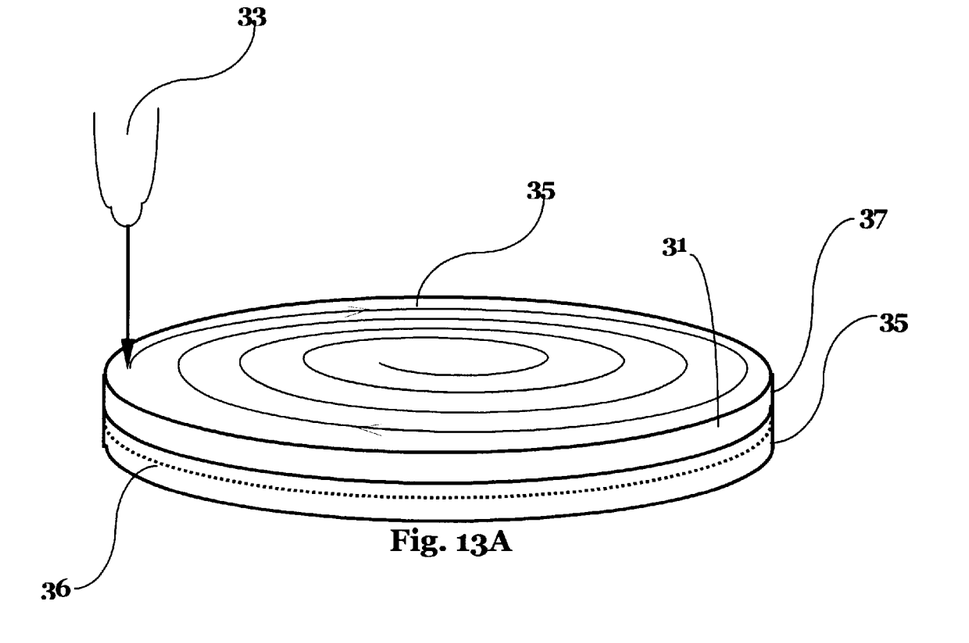
FIG. 13 illustrates the forth preferred embodiment of the separation process due to the present invention where a water jet is used.
Figure 13B:
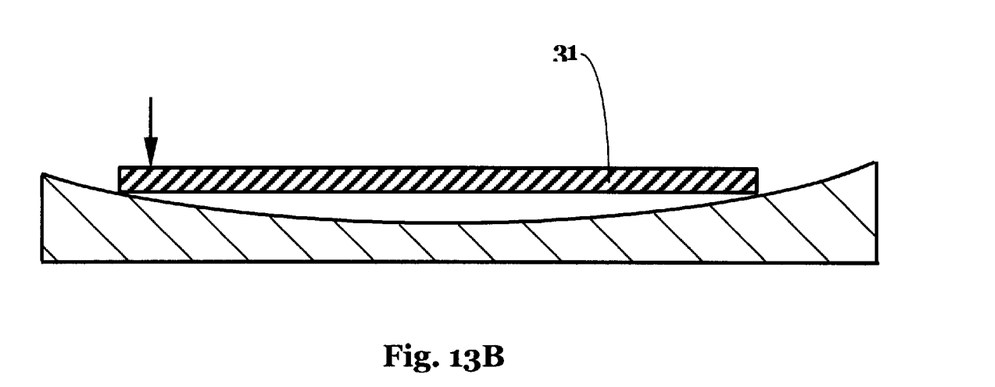

FIG. 13 shows the preferred embodiment utilizing a water jet source to separate the donor substrate material. The water jet nozzle 33 is initially aligned to the edge of the wafer assembly 31 to be separated. The wafer assembly consists of implanted wafer 35 with hydrogen layer 36 and stiffener wafer 37 attached to implantation side of the wafer 35. The water jet nozzle moves with a speed of 0.01 to 0.1 cm/sec towards the center of the wafer assembly 31. The wafer assembly is placed onto a supporting turntable that has a spherical shaped surface with radius of curvature between 1 and 2 meters. The turntable is made of material that has adequate rigidity, for example, stainless steel. The turntable is rotating with speed 0.1 to 10 rotations per second. The water jet beam trajectory on the wafer assembly 31 forms a spiral 38 of continuously decreasing radius. The wafer assembly cleavage begins at the edge of the wafers. The cleaved part propagates inward with the jet and turntable movements. The wafer assembly separates completely when the jet reaches the center of the wafer assembly 31. The typical water jet characteristics are: nozzle diameter of 1.6 millimeter, nozzle exit velocity 27 cm/sec (that gives a corresponding Reynolds number Re=430). The nozzle diameter can vary from 0.1 to 2 millimeters, and the nozzle exit velocity can vary from 10 to 100 cm/sec for typical wafer configurations. Under the water jet action the wafer assembly 31 bends, the strain concentrates at the hydrogen-rich layer, thus encouraging the hydrogen atom movements inside the silicon. The displaced hydrogen forms platelets the same way as under diffusion activation at elevated temperatures. The platelets form a continuous hydrogen layer that separates the wafer assembly 31 into two wafers with cleaving along the <100> preferred plane.

Preferred Embodiment 5: Separating with Mechanical Linkages and Structure

Figure 14A:
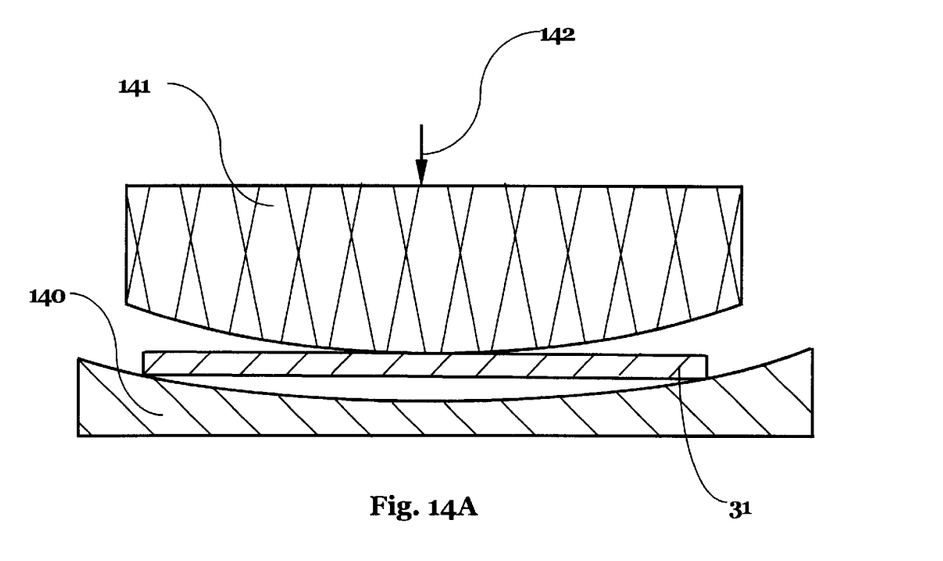
FIG. 14 illustrates the fifth preferred embodiment of the separation process due to the present invention where mechanical structures are used.
Figure 14B:
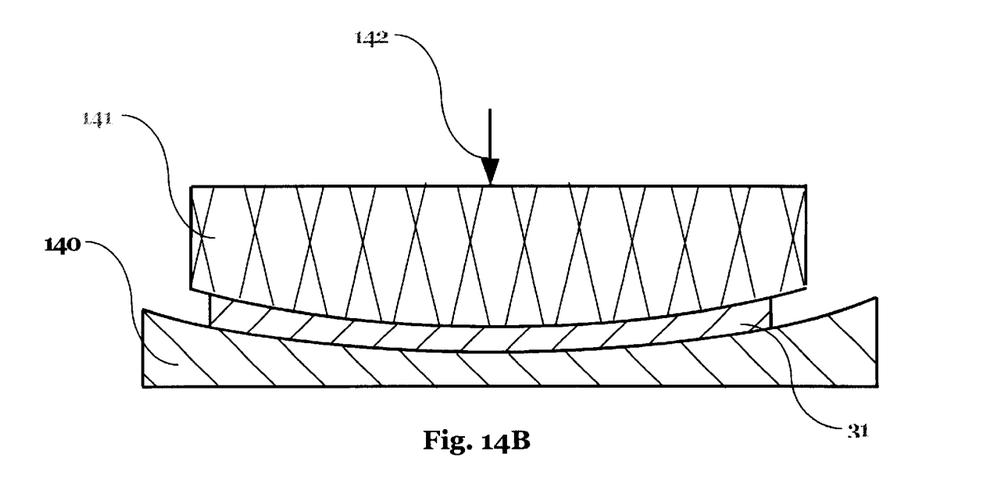

FIG. 14 shows the preferred embodiment applying mechanical linkages and structure. FIG. 14A illustrates the initial position when the wafer assembly 31 is placed onto anvil 140 and piston 141 is in its top position. Next, a mechanical force 142 is applied to the piston and the piston moves all the way down reaching its bottom position as shown on FIG. 14B. With this preferred embodiment the wafer assembly 31 bends and gets a shape predetermined by said anvil 140 and piston 141. The bend gives the mechanical stress to the wafer and the stress promotes hydrogen movement inside the wafer assembly 31 that has the hydrogen-rich layer. If the radii of curvature are chosen properly, the wafer assembly gets stress that is not enough to break it in an unintentional place, but enough to separate it along the weakened hydrogen-rich plane. The radii of curvature for the assembly is typically from 0.6 to 3 meters.

What is claimed is:

1. A process for manufacturing a silicon-on-insulator wafer from a silicon wafer assembly, said process comprising the steps of:

providing a wafer assembly comprising a donor substrate having an insulator layer on a surface and a hydrogen-rich layer at a selected depth below said surface defining a single-crystalline silicon layer above said selected depth, and an acceptor substrate bonded to said surface for accepting said insulator layer and said single-crystalline silicon layer above said selected depth, and;

applying to said wafer assembly an amount of energy directed to a flat surface of said wafer assembly from an energy source selected from the group consisting of ultrasound, infrared, hydrostatic pressure, hydrodynamiic pressure, mechanical, and a combination thereof, wherein said amount of energy is sufficient to transform said hydrogen-rich layer into a continuous hydrogen layer thereby releasing said single-crystalline silicon layer.

2. The process of claim 1, wherein said donor substrate is a silicon wafer.

3. The process of claim 1, wherein said donor substrate comprises single-crystalline silicon.

4. The process of claim 1, wherein said insulator layer comprises silicon dioxide.

5. The process of claim 1, wherein said acceptor substrate is single-crystalline silicon.

6. The process of claim 1, wherein said energy source is ultrasound.

7. The process of claim 6, wherein said ultrasound is a self-resonance mode ultrasound with an acoustic strain amplitude of at least $10^{-5}$.

8. The process of claim 1, wherein said energy source is an infrared energy source.

9. The process of claim 1, wherein said infrared energy source provides infrared light that has a wavelength outside the silicon band edge absorption.

10. The process of claim 1, wherein said hydrostatic pressure energy source provides a hydrostatic pressure having an amplitude of at least 0.2 GPa.

11. The process of claim 1, wherein said hydrodynamic pressure energy source comprises a water jet.

12. The process of claim 1, wherein said mechanical source comprises a structure to which a force may be applied in order to provide mechanical energy.

13. The process of claim 12, wherein said mechanical energy is applied to said structure which has a radius of curvature from about 0.6 to 3 meters.

* * * * *